(12) United States Patent
Akamatsu

(10) Patent No.: US 7,829,924 B2
(45) Date of Patent: Nov. 9, 2010

(54) SEMICONDUCTOR DEVICE AND METHOD FOR FABRICATING THE SAME

(75) Inventor: Susumu Akamatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/545,521

(22) Filed: Oct. 11, 2006

(65) Prior Publication Data
US 2007/0158721 A1 Jul. 12, 2007

(30) Foreign Application Priority Data
Jan. 6, 2006 (JP) ............................. 2006-001636

(51) Int. Cl.
*H01L 23/58* (2006.01)
*H01L 29/00* (2006.01)
(52) U.S. Cl. .................... 257/296; 257/501; 257/506; 257/510; 257/E21.279; 257/E21.696; 438/124; 438/112

(58) Field of Classification Search ............... 438/123, 438/124, 112, 238; 257/296, 300, E21.279, 257/E21.696, 501–510
See application file for complete search history.

(56) References Cited

U.S. PATENT DOCUMENTS
2005/0032275 A1* 2/2005 Toda et al. ................. 438/123

FOREIGN PATENT DOCUMENTS
JP 5-21591 1/1993

OTHER PUBLICATIONS
Yang et al., "Dual Stress Liner for High Performance sub-45nm Gate Length SOI CMOS Manufacturing," IEDM 2004 Late News, 2004.

* cited by examiner

*Primary Examiner*—Cuong Q Nguyen
*Assistant Examiner*—Cathy N Lam
(74) *Attorney, Agent, or Firm*—McDermott Will & Emery LLP

(57) ABSTRACT

A trench isolation surrounding the lateral sides of an active region of a P-channel MIS transistor PTr and a trench isolation surrounding the lateral sides of an active region of an N-channel MIS transistor NTr have different film qualities.

10 Claims, 14 Drawing Sheets

FIG. 3A
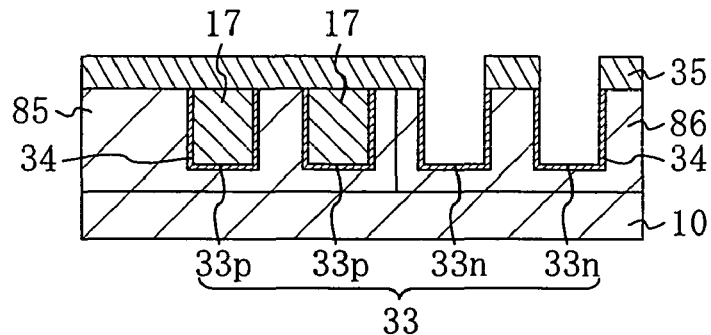
FIG. 3B
FIG. 3C
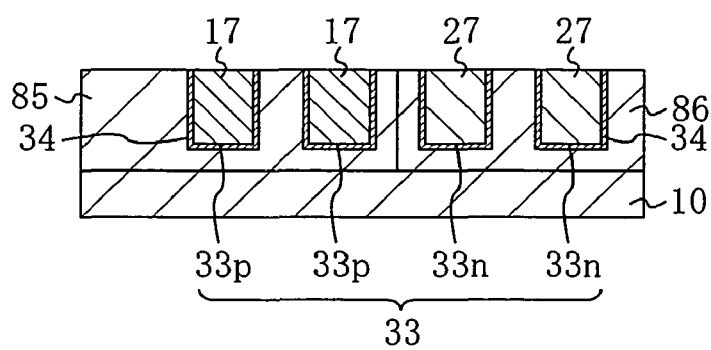
FIG. 3D
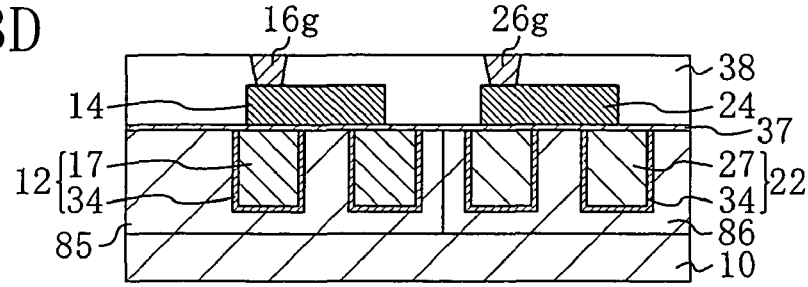

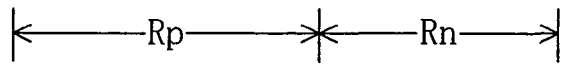
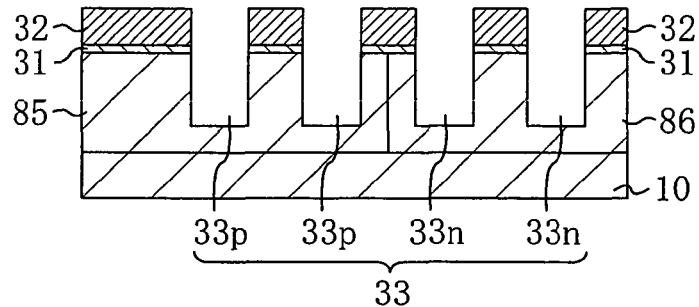
FIG. 5A
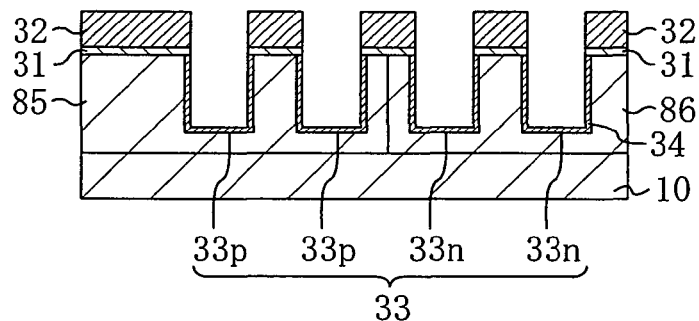
FIG. 5B
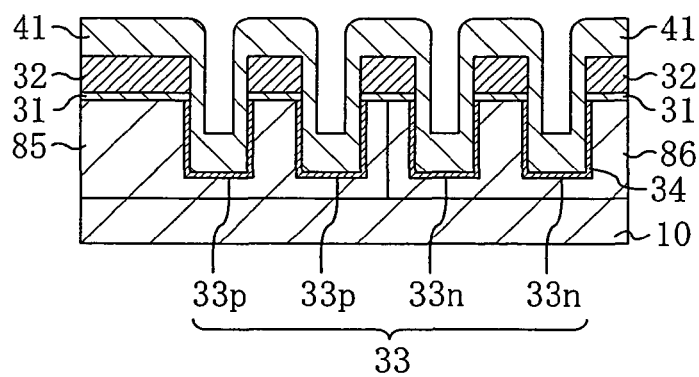
FIG. 5C
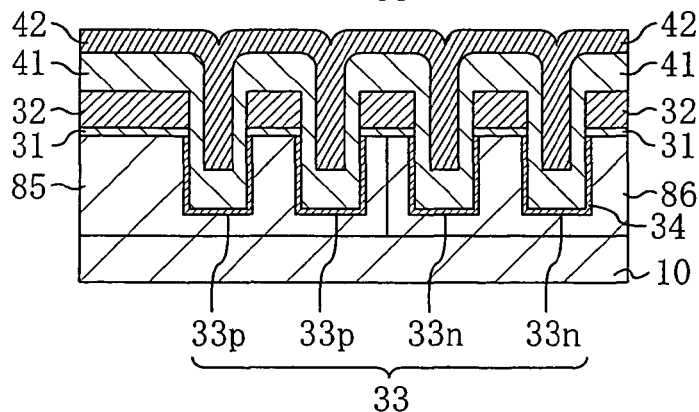
FIG. 5D

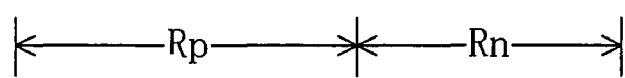
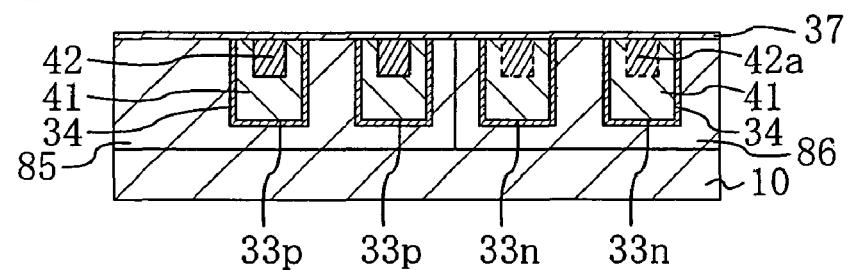
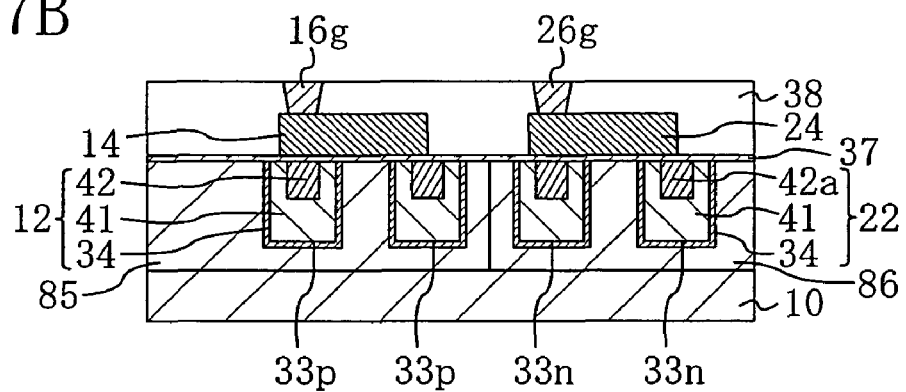

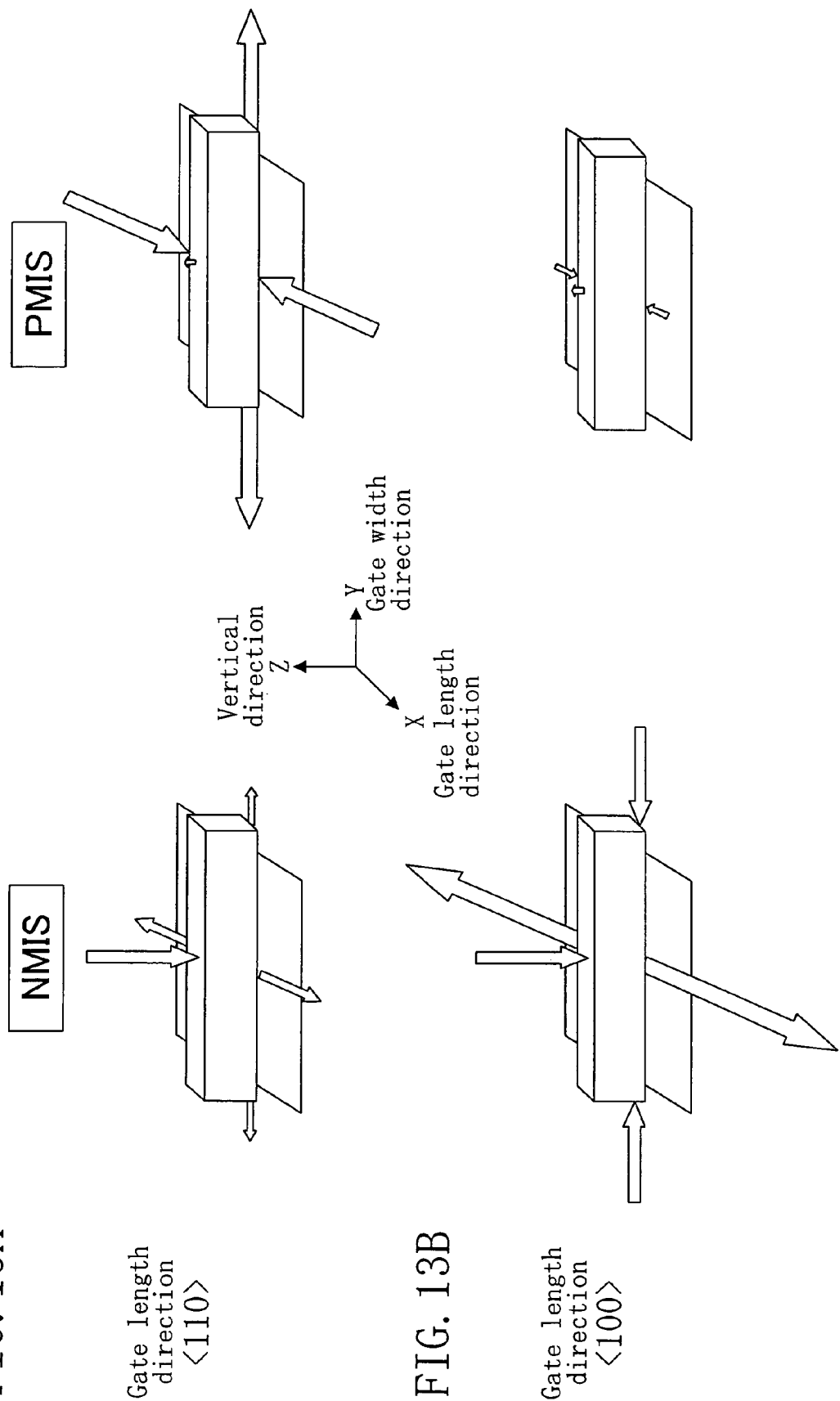

SEMICONDUCTOR DEVICE AND METHOD FOR FABRICATING THE SAME

CROSS-REFERENCE TO RELATED APPLICATIONS

The disclosure of Japanese Patent Application No. 2006-001636 filed Jan. 6, 2006 including specification, drawing and claims is incorporated herein by reference in its entirely.

BACKGROUND OF THE INVENTION

The present invention relates to a semiconductor device and a method for fabricating the same, and particularly relates to a semiconductor device whose transistor characteristics can be improved by filling respective isolation regions formed in the semiconductor substrate with different materials and a method for forming filled-in regions locally having different stresses.

In recent years, as semiconductor integrated circuits have been increasing in packaging density, functionality and speed, there has been a proposed technique in which stress is applied to the channel of a transistor by a stressor film so as to increase the driving force thereof. For example, if a high stressor film is used as a liner film, it is possible to increase stress that is applied to the channel.

The direction of stress for increasing driving force of an N-channel MIS transistor is opposite to the direction of stress for increasing driving force of a P-channel MIS transistor. In view of this, a method was proposed in which different stress liner films are formed on transistors of different conductivity types (see, for example, H. S. Yang. et al. IEDM 2004, p 1075).

FIG. 14 is a cross-sectional view illustrating the structure of a conventional semiconductor device. In the semiconductor device illustrated in FIG. 14, an N-channel MIS transistor NTr and a P-channel MIS transistor PTr are arranged. A liner film 103 having tensile stress is formed on a gate electrode 101 and a doped layer 102 in the N-channel MIS transistor NTr, while a liner film 113 having compressive stress is formed on a gate electrode 111 and a doped layer 112 in the P-channel MIS transistor PTr.

SUMMARY OF THE INVENTION

However, in the case where the different liner films are formed depending on the conductivity types of the transistors, there is a problem in that the number of process steps is increased to cause the process to become complicated. Furthermore, as downsizing of semiconductor devices has resulted in decrease in the distance between transistors, another problem has also occurred in that it has become difficult to form a different liner film for each transistor.

The present invention was made in view of the above problems, and it is therefore an object of the present invention to increase driving force of a transistor by applying stress to the channel of the transistor through a simple process.

A first inventive semiconductor device includes: a first semiconductor region in which a first MIS transistor is formed; a second semiconductor region in which a second MIS transistor is formed; a first trench isolation region surrounding lateral sides of the first semiconductor region; and a second trench isolation region surrounding lateral sides of the second semiconductor region, wherein at least part of the first trench isolation region and part of the second trench isolation region have different film qualities.

In the first inventive semiconductor device, the direction or magnitude of stress that each trench isolation region applies to the channel of the corresponding MIS transistor can be changed by changing the film quality of the trench isolation region according to the type of the MIS transistor. This enables the driving force of each transistor to be adjusted and increased.

In the first inventive semiconductor device, direction or magnitude of stress that the first trench isolation region applies to a channel of the first MIS transistor may be different from direction or magnitude of stress that the second trench isolation region applies to a channel of the second MIS transistor.

In the first inventive semiconductor device, the first MIS transistor may be an N-channel MIS transistor, and the second MIS transistor may be a P-channel MIS transistor. Generally, since the direction of stress necessary for increasing the driving force of an N-channel MIS transistor is different from the direction of stress necessary for increasing the driving force of a P-channel MIS transistor, the application of the present invention is particularly effective.

In the first inventive semiconductor device, direction or magnitude of stress applied to a channel of the first MIS transistor by parts of the first trench isolation region located at both sides of the first semiconductor region in a gate width direction may be different from direction or magnitude of stress applied to a channel of the second MIS transistor by parts of the second trench isolation region located at both sides of the second semiconductor region in a gate width direction.

In the first inventive semiconductor device, compressive stress in parts of the first trench isolation region located at both sides of the first semiconductor region in a gate width direction may be greater than compressive stress in parts of the second trench isolation region located at both sides of the second semiconductor region in a gate width direction.

In the first inventive semiconductor device, density in parts of the first trench isolation region located at both sides of the first semiconductor region in a gate width direction may be different from density in parts of the second trench isolation region located at both sides of the second semiconductor region in a gate width direction.

In the first inventive semiconductor device, parts of the second trench isolation region located at both sides of the second semiconductor region in a gate width direction may include a multilayer film of a silicon oxide film and a silicon film, while parts of the first trench isolation region located at both sides of the first semiconductor region in a gate width direction may include a silicon oxide film but do not have to include a silicon film.

In the first inventive semiconductor device, direction or magnitude of stress applied to a channel of the first MIS transistor by parts of the first trench isolation region located at both sides of the first semiconductor region in a gate length direction may be different from direction or magnitude of stress applied to a channel of the second MIS transistor by parts of the second trench isolation region located at both sides of the second semiconductor region in a gate length direction.

In the first inventive semiconductor device, compressive stress in parts of the second trench isolation region located at both sides of the second semiconductor region in a gate length direction may be greater than compressive stress in parts of the first trench isolation region located at both sides of the first semiconductor region in a gate length direction.

In the first inventive semiconductor device, density in parts of the first trench isolation region located at both sides of the first semiconductor region in a gate length direction may be different from density in parts of the second trench isolation region located at both sides of the second semiconductor region in a gate length direction.

In the first inventive semiconductor device, parts of the first trench isolation region located at both sides of the first semiconductor region in a gate length direction may include a multilayer film of a silicon oxide film and a silicon film, while parts of the second trench isolation region located at both sides of the second semiconductor region in a gate length direction may include a silicon oxide film but do not have to include a silicon film.

In the first inventive semiconductor device, the first trench isolation region and the second trench isolation region may be formed so as to be adjacent to each other.

In the first inventive semiconductor device, part of the first trench isolation region and part of the second trench isolation region that are located between the first semiconductor region and the second semiconductor region may be formed in a single trench.

A first inventive semiconductor device fabrication method is a method for fabricating a semiconductor device that includes a first semiconductor region in which a first MIS transistor is formed and a second semiconductor region in which a second MIS transistor is formed. The first inventive method includes the steps of: (a) forming a first trench in part of a semiconductor layer that surrounds lateral sides of the first semiconductor region, and forming a second trench in part of the semiconductor layer that surrounds lateral sides of the second semiconductor region; and (b) filling the first trench to thereby form a first trench isolation region and filling the second trench to thereby form a second trench isolation region, wherein, in the step (b), at least part of the first trench isolation region and part of the second trench isolation region are formed so as to have different film qualities.

According to the first inventive method, by changing the film qualities of the trench isolation regions, it is possible to form the trench isolation regions that apply stresses to their surroundings in different directions or apply stresses of different magnitudes to their surroundings. Therefore, the directions or magnitudes of stresses that the trench isolation regions apply to the channels of the respective transistors are different, whereby the driving force of each transistor can be adjusted and increased.

In the first inventive method, in the step (b), direction or magnitude of stress that the first trench isolation region applies to a channel of the first MIS transistor may be different from direction or magnitude of stress that the second trench isolation region applies to a channel of the second MIS transistor.

In the first inventive method, in the step (b), the first and second trenches may be filled with insulating films of different densities.

In the first inventive method, the step (b) may include the sub-steps of: (b1) forming a silicon oxide film that covers a surface of the first trench and a surface of the second trench by performing thermal oxidation; (b2) forming, on the silicon oxide film, a silicon film with which the first and second trenches are filled; and (b3) subjecting part of the silicon film located in the first trench to oxidation, and leaving part of the silicon film located in the second trench without subjecting that part to oxidation.

In the first inventive method, in the step (a), the first and second trenches may be formed as a single trench between the first and second semiconductor regions.

BRIEF DESCRIPTION OF THE DRAWINGS

FIG. 1A is a view illustrating the planar structure of a semiconductor device according to a first embodiment of the present invention, while

FIGS. 3A through 3D are cross-sectional views illustrating process steps for fabricating the semiconductor device according to the first embodiment of the present invention.

FIG. 4A is a view illustrating the planar structure of a semiconductor device according to a second embodiment of the present invention, while

FIGS. 5A through 5D are cross-sectional views illustrating process steps for fabricating the semiconductor device according to the second embodiment of the present invention.

FIGS. 7A and 7B are cross-sectional views illustrating process steps for fabricating the semiconductor device according to the second embodiment of the present invention.

FIG. 8A is a view illustrating the planar structure of a semiconductor device according to a modified example of the second embodiment, while

FIG. 9A is a view illustrating the planar structure of a semiconductor device according to a third embodiment of the present invention, while

FIGS. 13A and 13B illustrate the directions and magnitudes of stresses for increasing driving forces of MIS transistors.

DETAILED DESCRIPTION OF THE INVENTION

First Embodiment

Figure 1A:
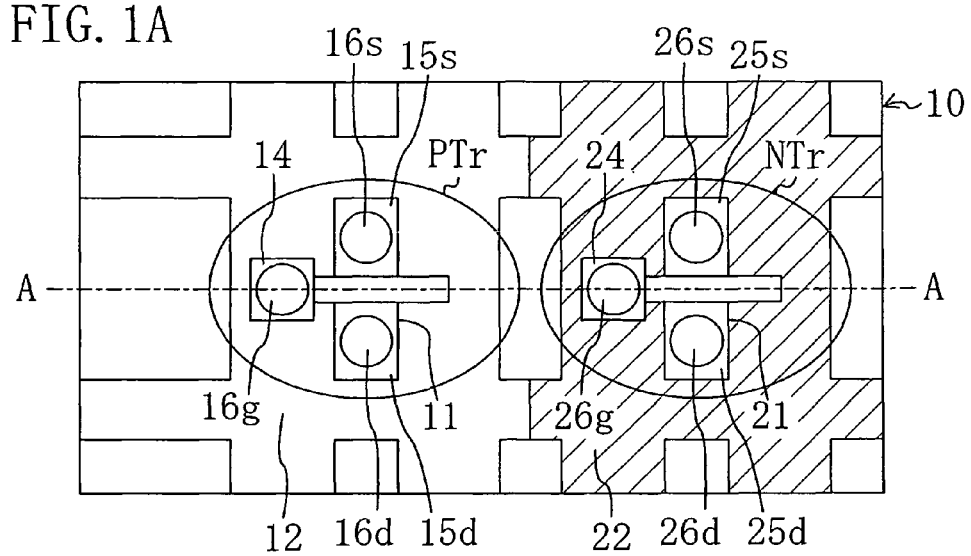
Figure 1B:
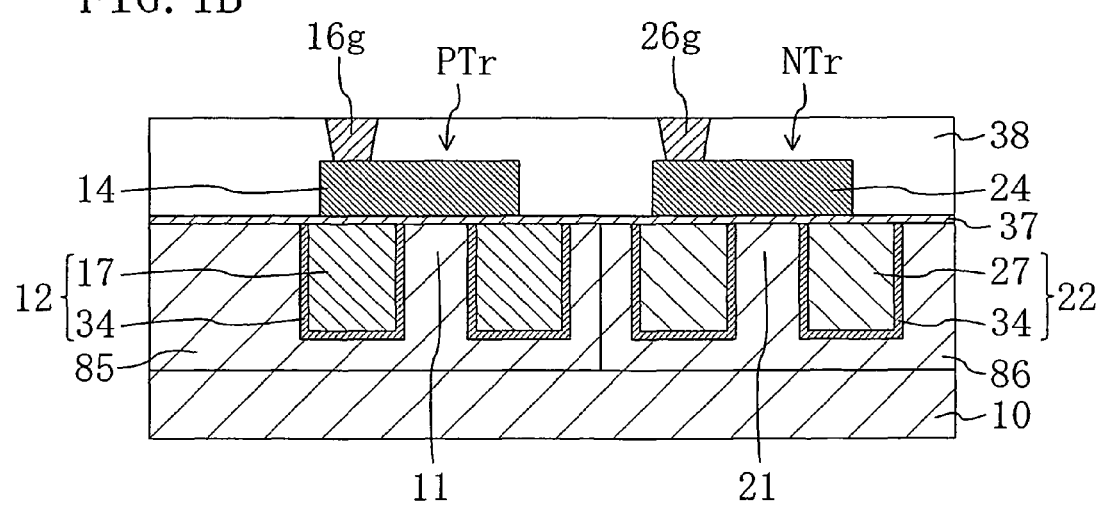
FIG. 1B is a cross-sectional view taken along the line A-A in FIG. 1A.

FIG. 1A is a view illustrating the planar structure of a semiconductor device according to a first embodiment of the present invention. FIG. 1B is a cross-sectional view taken along the line A-A in FIG. 1A. As shown in FIGS. 1A and 1B, in the semiconductor device of this embodiment, a P-channel MIS transistor PTr and an N-channel MIS transistor NTr are arranged on a semiconductor substrate 10. In the semiconductor substrate 10, an N-type well 85 is formed in the region in which the P-channel MIS transistor PTr is formed, while a P-type well 86 is formed in the region in which the N-channel MIS transistor NTr is formed. In this embodiment, an exemplary case in which the gate length direction matches with the <100> direction of the semiconductor substrate 10 will be described.

As shown in FIGS. 1A and 1B, the lateral faces of an active region 11 in the P-channel MIS transistor PTr are surrounded by a trench isolation 12. The trench isolation 12 has a structure in which the trench is filled with a silicon nitride film (which will be hereinafter referred to as a "plasma SiN film") 17 with a silicon oxide film 34 interposed therebetween. The plasma SiN film 17 is formed by a plasma CVD method, while the silicon oxide film 34 is formed by a thermal oxidation process. The trench isolation 12 applies compressive stress to the channel region in the P-channel MIS transistor PTr.

And a gate electrode 14 made of polysilicon is formed in a region over the active region 11 and over parts of the trench isolation 12 located at both sides of the active region 11, with a gate insulating film 37 interposed therebetween. In the active region 11, a source region 15s and a drain region 15d are formed alongside the gate electrode 14.

The P-channel MIS transistor PTr is covered with an interlayer dielectric film 38. Through the interlayer dielectric film 38, a source contact 16s is formed on the source region 15s, a drain contact 16d is formed on the drain region 15d, and a gate contact 16g is formed on a contact formation region of the gate electrode 14.

On the other hand, the lateral faces of an active region 21 of the N-channel MIS transistor NTr are surrounded by a trench isolation 22. The trench isolation 22 has a structure in which the trench is filled with a silicon nitride film (which will be hereinafter referred to as a "plasma SiN film") 27 with a silicon oxide film 34 interposed therebetween. The plasma SiN film 27 is formed by a plasma CVD method, while the silicon oxide film 34 is formed by a thermal oxidation process. The trench isolation 22 applies tensile stress to the channel region in the N-channel MIS transistor NTr.

The direction (compression or tension) in which a plasma SiN film applies stress to its surrounding area changes depending upon the fabrication method of the plasma SiN film. Therefore, if the plasma SiN film 17 in the trench isolation 12 for the P-channel MIS transistor PTr and the plasma SiN film 27 in the trench isolation 22 for the N-channel MIS transistor NTr are fabricated by different methods, it is possible to make the plasma SiN films 17 and 27 have different film qualities and densities, whereby the directions in which the trench isolations apply stress to their surroundings can be changed.

A gate electrode 24 made of polysilicon is formed in a region over the active region 21 and over parts of the trench isolation 22 located at both sides of the active region 21, with the gate insulating film 37 interposed therebetween. In the active region 21, a source region 25s and a drain region 25d are formed alongside the gate electrode 24.

The N-channel MIS transistor NTr is covered with the interlayer dielectric film 38. Through the interlayer dielectric film 38, a source contact 26s is formed on the source region 25s, a drain contact 26d is formed on the drain region 25d, and a gate contact 26g is formed on a contact formation region of the gate electrode 24.

Next, it will be described how to fabricate the semiconductor device of this embodiment with reference to related drawings. FIGS. 2A to 3D are cross-sectional views illustrating process steps for fabricating the semiconductor device according to the first embodiment of the present invention. In FIGS. 2A to 3D, there are provided a region (P-channel MIS transistor formation region) Rp in which a P-channel MIS transistor PTr is to be formed, and a region (N-channel MIS transistor formation region) Rn in which an N-channel MIS transistor NTr is to be formed.

Figure 2A:
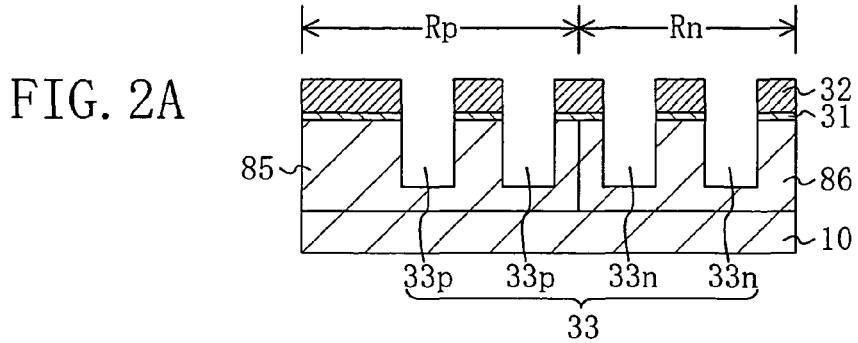
FIGS. 2A through 2E are cross-sectional views illustrating process steps for fabricating the semiconductor device according to the first embodiment of the present invention.

In the fabrication method of this embodiment, the following process steps are performed to obtain the structure shown in FIG. 2A. First, in a semiconductor substrate 10 made of silicon, an N-type well 85 is formed in the P-channel MIS transistor formation region Rp and a P-type well 86 is formed in the N-channel MIS transistor formation region Rn. Then, a silicon oxide film 31 and a silicon nitride film 32 are deposited in this order over the silicon semiconductor substrate 10 by CVD process. Next, a resist pattern (not shown) having openings corresponding to isolation formation regions is formed on the silicon nitride film 32. Thereafter, with the resist pattern used as a mask, an etching process is performed to remove unnecessary part of the silicon nitride film 32 and silicon oxide film 31 and then remove part of the semiconductor substrate 10 to the desired depth, thereby forming trenches 33. The trenches 33 include a trench 33p in the P-channel MIS transistor formation region Rp and a trench 33n in the N-channel MIS transistor formation region Rn.

Figure 2B:
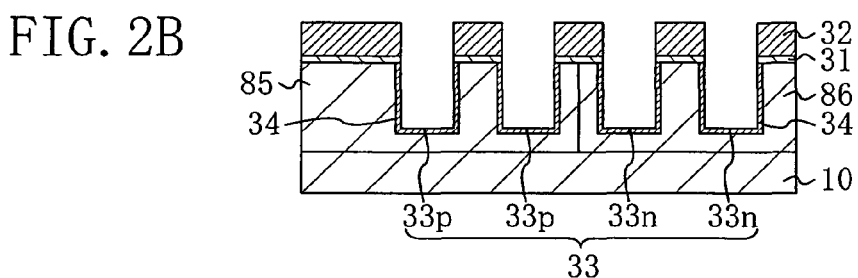

Subsequently, in the process step shown in FIG. 2B, the semiconductor substrate 10 is subjected to a thermal oxidation process, thereby forming a silicon oxide film 34 on the surfaces of the trenches 33p and 33n.

Figure 2C:
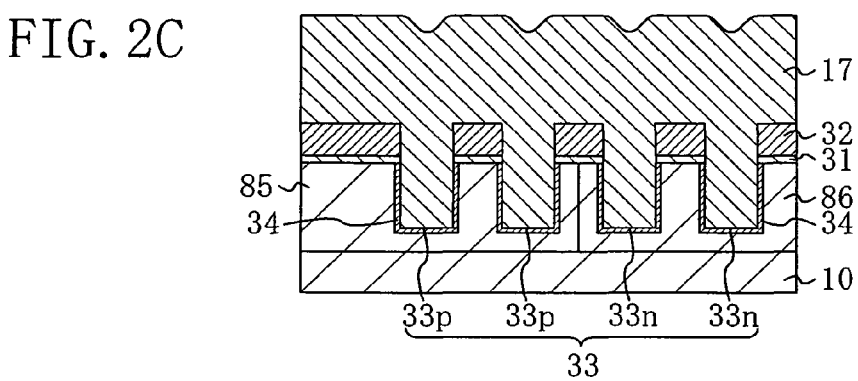

Then, in the process step shown in FIG. 2C, a plasma SIN film 17, which produces compressive stress, is formed over the entire surface of the semiconductor substrate 10 by a plasma CVD method to a thickness that allows the trenches 33p and 33n to be completely filled with the plasma SIN film 17. The "plasma SIN film which produces compressive stress" means that the stress that the plasma SIN film applies to its surrounding area is compressive stress, and the plasma SIN film 17 therefore applies compressive stress to the channel region. The plasma SIN film 17 that produces compressive stress can be formed by performing the plasma CVD method under such conditions that permit the plasma SIN film 17 to have a high content of hydrogen (H).

Figure 2D:
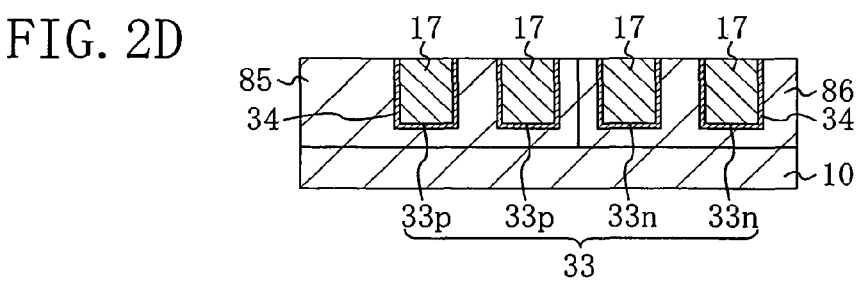

Next, in the process step shown in FIG. 2D, the plasma SIN film 17 is polished by a CMP process until the surface of the silicon nitride film 32 is exposed, thereby performing the planarization. Thereafter, the silicon nitride film 32 and the silicon oxide film 31 are etched to expose the surface of the semiconductor substrate 10. In this process step, the silicon nitride film 32 and the silicon oxide film 31 may be polished and removed by the CMP process to such an extent that the surface of the semiconductor substrate 10 is not exposed.

Figure 2E:
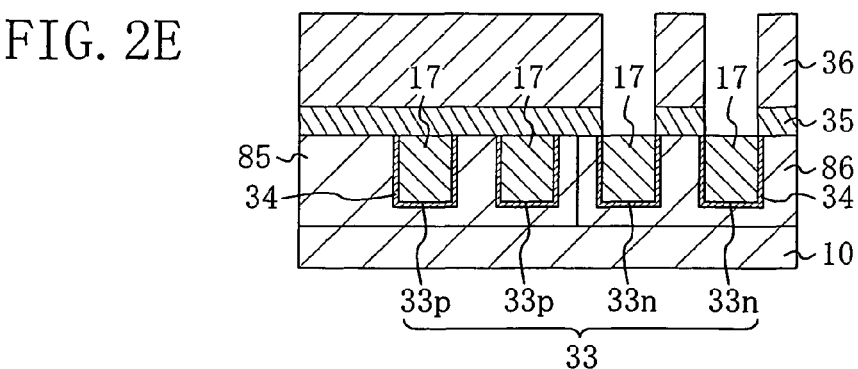

Subsequently, in the process step shown in FIG. 2E, a silicon nitride film 35 is deposited over the semiconductor substrate 10, and then a resist pattern 36, which covers the trench 33p and has an opening over the trench 33n, is formed on the silicon nitride film 35. And with the resist pattern 36 used as a mask, the silicon nitride film 35 is etched, thereby removing part of the silicon nitride film 35 located on the trench 33n.

Next, in the process step shown in FIG. 3A, the resist pattern 36 is removed, and thereafter, with the silicon nitride film 35 used as a mask, an etching process is performed to remove the plasma SIN film 17 in the trench 33n.

Then, in the process step shown in FIG. 3B, a plasma SIN film 27, which produces tensile stress, is formed over the entire surface of the semiconductor substrate 10 by a plasma CVD method to a thickness that allows the trench 33n to be completely filled with the plasma SIN film 27. The "plasma SIN film which produces tensile stress" means that the stress that the plasma SIN film applies to its surrounding area is tensile stress, and the plasma SIN film 27 therefore applies tensile stress to the channel region. The plasma SIN film 27 that produces tensile stress can be formed, if the film formation in the plasma CVD process is performed under such conditions that allow the film to have a high content of hydrogen (H), and then the hydrogen (H) in the film is removed by UV irradiation, for example, to increase Si—N bonds in the film.

Then, in the process step shown in FIG. 3C, the plasma SIN film 27 is polished until the surface of the silicon nitride film 35 is exposed, thereby performing the planarization. Thereafter, the silicon nitride film 35 is etched to expose the surface of the semiconductor substrate 10. In this process step, the silicon nitride film 35 may be polished and removed by a CMP process to such an extent that the surface of the semiconductor substrate 10 is not exposed.

Subsequently, in the process step shown in FIG. 3D, source/drain regions 25s and 25d (shown in FIG. 1A), gate electrodes 14 and 24, an interlayer dielectric film 38, and contacts 16g, 16s, 16d, 26g, 26s, and 26d (shown in FIG. 1A) are formed. By the foregoing process steps, the semiconductor device of this embodiment is obtained.

In this embodiment, the plasma SIN films 17 and 27 are formed under different fabrication conditions so as to have different film qualities and densities, whereby the magnitude and direction of the stress that the trench isolation 12 applies to the channel of the corresponding MIS transistor is different from those of the stress that the trench isolation 22 applies to the channel of the corresponding MIS transistor. In this manner, the direction and magnitude of the stress are changed depending upon the type of each MIS transistor, which enables the driving force of each transistor to be adjusted and increased.

In the case described in this embodiment, the entire trench isolation 12 and the entire trench isolation 22 have different film qualities and densities. Nevertheless, only parts of the trench isolations 12 and 22 that are located at both ends of the respective active regions in the gate length directions may have different film qualities and densities. In that case, the value of the compressive stress applied to the channel of the P-channel MIS transistor in the gate length direction may be made greater than the value of the compressive stress applied to the channel of the N-channel MIS transistor in the gate length direction. Alternatively, only parts of the trench isolations 12 and 22 that are located at both ends of the respective active regions in the gate width directions may have different film qualities and densities. In that case, the value of the compressive stress applied to the channel of the N-channel MIS transistor in the gate width direction may be made greater than the value of the compressive stress applied to the channel of the P-channel MIS transistor in the gate width direction.

Second Embodiment

Figure 4A:
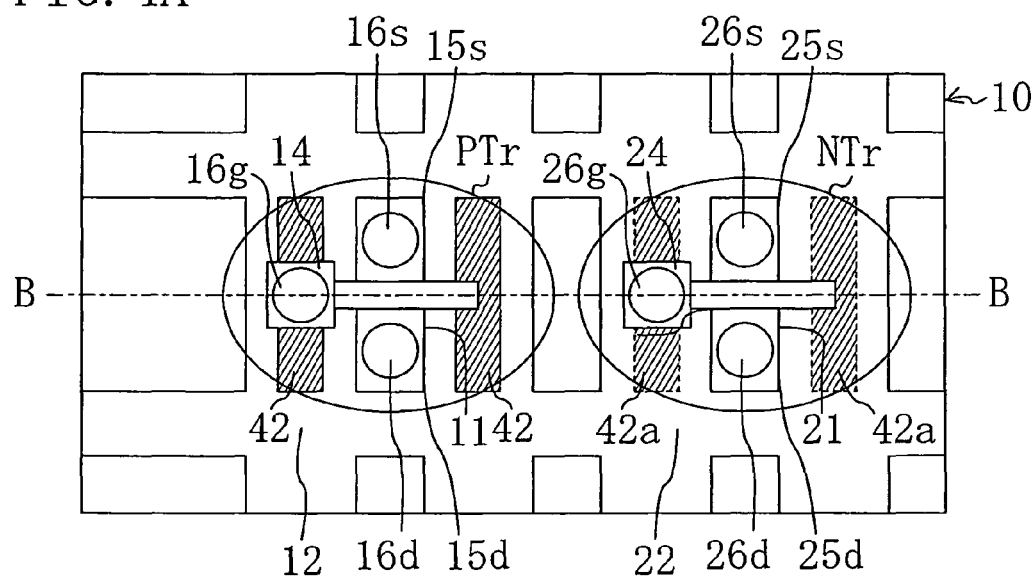
Figure 4B:
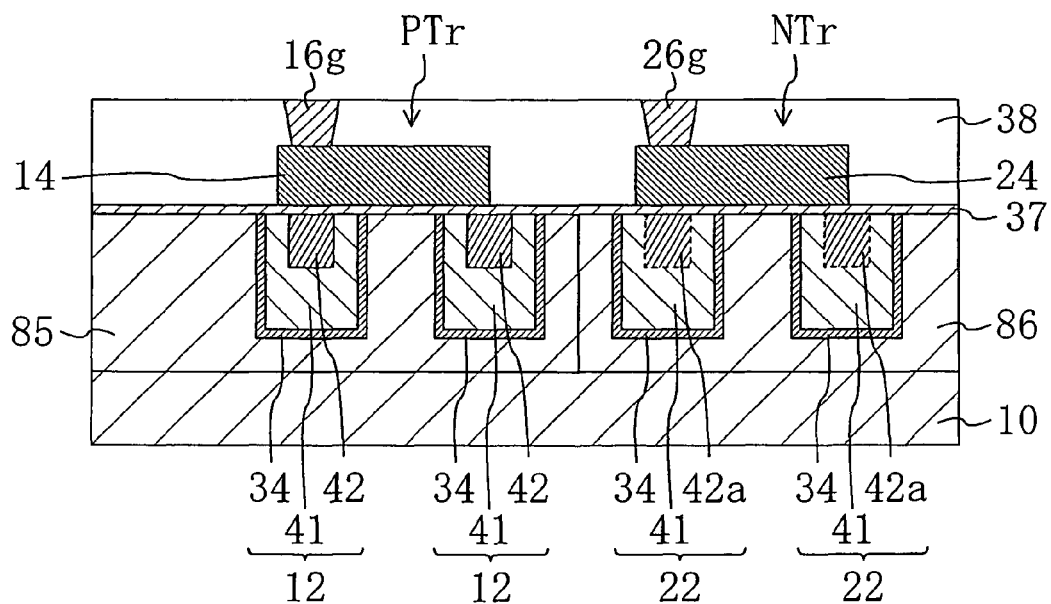
FIG. 4B is a cross-sectional view taken along the line B-B in FIG. 4A.

FIG. 4A is a view illustrating the planar structure of a semiconductor device according to a second embodiment of the present invention. FIG. 4B is a cross-sectional view taken along the line B-B in FIG. 4A. As shown in FIGS. 4A and 4B, in the semiconductor device of this embodiment, a P-channel MIS transistor PTr and an N-channel MIS transistor NTr are arranged on a semiconductor substrate 10. In the semiconductor substrate 10, an N-type well 85 is formed in the region in which the P-channel MIS transistor PTr is formed, while a P-type well 86 is formed in the region in which the N-channel MIS transistor NTr is formed. In this embodiment, an exemplary case, in which the gate length direction matches with the <100> direction of the semiconductor substrate 10, will be described.

The lateral faces of an active region 11 in the P-channel MIS transistor PTr are surrounded by a trench isolation 12. Parts of the trench isolation 12, which are located at the sides of the gate width direction, include a silicon oxide film 34, a silicon oxide film (which will be hereinafter referred to as a "CVD oxide film") 41, and a polysilicon film 42. The silicon oxide film 34 is formed on the surface of the trench by a thermal oxidation process. The CVD oxide film 41 is formed on the silicon oxide film 34 in the trench by a CVD process and has the shape of a recess in cross section. The polysilicon film 42 is formed on the CVD oxide film 41 in the trench so as to fill in the recess. Parts of the trench isolation 12 located at the sides of the gate length direction include the silicon oxide film 34 formed on the surface of the trench by the thermal oxidation process and the CVD oxide film 41 formed on the silicon oxide film 34 in the trench so as to fill in the trench.

On the other hand, the lateral faces of an active region 21 in the N-channel MIS transistor NTr are surrounded by a trench isolation 22. Parts of the trench isolation 22, which are located at the sides of the gate width direction, include the silicon oxide film 34 formed on the surface of the trench by the thermal oxidation process, the CVD oxide film 41 formed on the silicon oxide film 34 in the trench and has the shape of a recess in cross section, and a silicon oxide film (which will be hereinafter referred to as a "polysilicon oxide film") 42a formed on the CVD oxide film 41 in the trench so as to fill in the recess and obtained by subjecting polysilicon to thermal oxidation. Parts of the trench isolation 22 located at the sides of the gate length direction include the silicon oxide film 34 formed on the surface of the trench by the thermal oxidation process and the CVD oxide film 41 formed on the silicon oxide film 34 in the trench so as to fill in the trench. Except for the kinds of films embedded in the trenches, the structure of this embodiment is the same as that of the first embodiment and the detailed descriptions thereof will be thus omitted herein.

Next, it will be described how to fabricate the semiconductor device of this embodiment with reference to related drawings. FIGS. 5A to 7B are cross-sectional views illustrating process steps for fabricating the semiconductor device according to the second embodiment of the present invention. In FIGS. 5A to 7B, there are provided a region Rp in which a P-channel MIS transistor PTr is to be formed, and a region Rn in which an N-channel MIS transistor NTr is to be formed.

In the fabrication method of this embodiment, the following process steps are performed to obtain the structure shown in FIG. 5A. First, in a semiconductor substrate 10 made of silicon, an N-type well 85 is formed in the P-channel MIS transistor formation region Rp and a P-type well 86 is formed in the N-channel MIS transistor formation region Rn. Then, a silicon oxide film 31 and a silicon nitride film 32 are deposited in this order over the silicon semiconductor substrate 10 by CVD process. Next, a resist pattern (not shown) having openings corresponding to isolation formation regions is formed on the silicon nitride film 32. Thereafter, with the resist pattern used as a mask, an etching process is performed to remove unnecessary part of the silicon nitride film 32 and silicon oxide film 31 and then remove part of the semiconductor substrate 10 to the desired depth, thereby forming trenches 33.

Subsequently, in the process step shown in FIG. 5B, the semiconductor substrate 10 is subjected to a thermal oxidation process, thereby forming a silicon oxide film 34 on the surfaces of the trenches 33.

Then, in the process step shown in FIG. 5C, a CVD oxide film 41 is formed over the entire surface of the semiconductor substrate 10 so as to cover the bottoms and lateral faces of the trenches 33. In this process step, the trenches 33 are not completely filled with the CVD oxide film 41 at the sides of the active region 11 in the gate width direction in the P-channel MIS transistor PTr and at the sides of the active region 21 in the gate width direction in the N-channel MIS transistor NTr so that recesses are formed in the middle portion in the trenches 33. These recesses may be formed by a method, for example, in which after the trenches 33 are completely filled with the CVD oxide film 41, only portions of the CVD oxide film 41 located at both sides of each active region 11 and 12 (i.e., both sides of each active region 11 and 12 in the gate width direction) are etched to form the recesses.

Next, in the process step shown in FIG. 5D, a polysilicon film 42 is formed on the CVD oxide film 41. In this process step, the polysilicon film 42 is formed to a thickness that allows the trenches 33 to be completely filled with the polysilicon film 42.

Figure 6A:
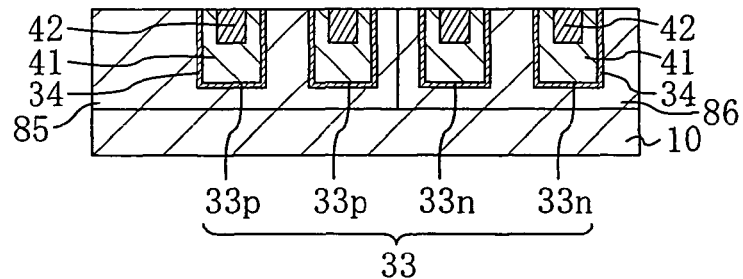
FIGS. 6A through 6D are cross-sectional views illustrating process steps for fabricating the semiconductor device according to the second embodiment of the present invention.

Next, in the process step shown in FIG. 6A, the CVD oxide film 41 and the polysilicon film 42 are polished by a CMP process until the surface of the silicon nitride film 32 is exposed, thereby performing the planarization. Thereafter, the silicon nitride film 32 and the silicon oxide film 31 are etched to expose the surface of the semiconductor substrate 10. In this process step, the silicon nitride film 32 and the silicon oxide film 31 may be polished and removed by the CMP process to such an extent that the surface of the semiconductor substrate 10 is not exposed.

Figure 6B:
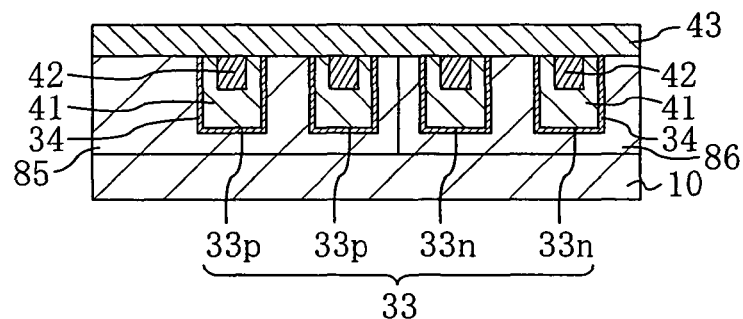

Subsequently, in the process step shown in FIG. 6B, a silicon nitride film 43 is deposited over the semiconductor substrate 10.

Figure 6C:
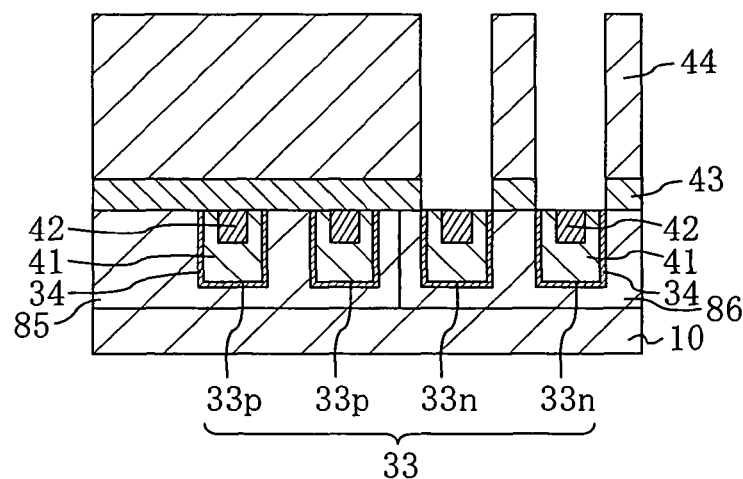

Next, in the process step shown in FIG. 6C, a resist pattern 44, which covers the trench 33p and has an opening over the trench 33n, is formed on the silicon nitride film 43. Then, with the resist pattern 44 used as a mask, the silicon nitride film 43 is etched, thereby removing part of the silicon nitride film 43 located on the trench 33n.

Figure 6D:
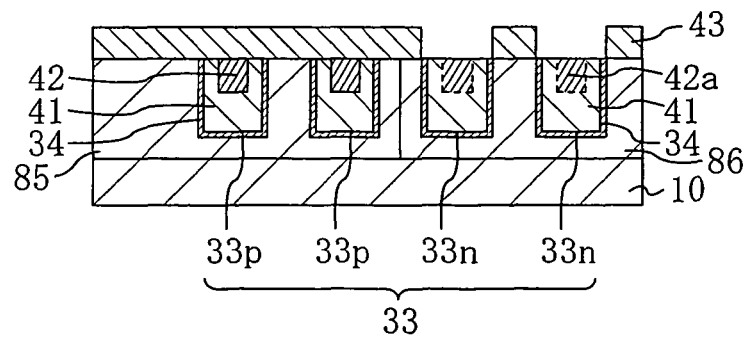

Then, in the process step shown in FIG. 6D, the resist pattern 44 is removed, and then, with the silicon nitride film 43 used as a mask, the polysilicon film 42 is subjected to a thermal oxidation process, whereby the polysilicon film 42 in the trench 33n is oxidized to a polysilicon oxide film 42a. By this process step, portions of the trench isolation 12, each of which includes the silicon oxide film 34 formed on the surface of the trench 33p, the CVD oxide film 41 formed on the silicon oxide film 34 and having the shape of a recess in cross section, and the polysilicon film 42 formed on the CVD oxide film 41 in the trench 33p so as to fill in the recess, are formed at the sides of the active region 11 in the gate width direction in the P-channel MIS transistor PTr. Other portions of the trench isolation 12, each of which includes the silicon oxide film 34 formed on the surface of the trench 33p and the CVD oxide film 41 formed on the silicon oxide film 34 in the trench 33p so as to fill in the trench 33p, are also formed at the sides of the active region 11 in the gate length direction in the P-channel MIS transistor PTr.

On the other hand, portions of the trench isolation 22, each of which includes the silicon oxide film 34 formed on the surface of the trench 33n, the CVD oxide film 41 formed on the silicon oxide film 34 and having the shape of a recess in cross section, and the polysilicon oxide film 42a formed on the CVD oxide film 41 in the trench 33n so as to fill in the recess, are formed at the sides of the active region 21 in the gate width direction in the N-channel MIS transistor NTr. Other portions of the trench isolation 22, each of which includes the silicon oxide film 34 formed on the surface of the trench 33n and the CVD oxide film 41 formed on the silicon oxide film 34 in the trench 33n so as to fill in the trench 33n, are also formed at the sides of the active region 21 in the gate length direction in the N-channel MIS transistor NTr.

Next, in the process step shown in FIG. 7A, the silicon nitride film 43 is removed selectively, and then the surfaces of the active regions 11 and 21 are subjected to a thermal oxidation process, thereby forming a gate insulating film 37. Thereafter, in the process step shown in FIG. 7B, gate electrodes 14 and 24, an interlayer dielectric film 38, and contacts 16g, 16s, 16d, 26g, 26s, and 26d (shown in FIGS. 4A and 4B) are formed. By the foregoing process steps, the semiconductor device of this embodiment is fabricated.

In this embodiment, in the process step shown in FIG. 6D, the polysilicon film 42 embedded in the trench 33n is subjected to oxidation to form the polysilicon oxide film 42a. Since the thermal oxidation causes the volume to increase, the compressive stress that the polysilicon oxide film 42a applies to its surroundings is stronger than that of the polysilicon film 42. It is therefore possible to apply stronger compressive stress to the channel in the gate width direction in the N-channel MIS transistor NTr than to the channel in the gate width direction in the P-channel MIS transistor PTr. As described above, in this embodiment, the direction and magnitude of stress are changed according to the type of each MIS transistor, which makes it possible to adjust and increase the driving force of the respective transistor.

In this embodiment, as shown in FIG. 4A, the portions of the trench isolations 12 and 22 located at both sides of the respective active regions 11 and 21 in the gate length direction are composed of the silicon oxide film 34 and the CVD oxide film 41, but may be composed of the silicon oxide film 34, the CVD oxide film 41, and the polysilicon film 42. In that case, in the process step shown in FIG. 5C, the following procedure may be carried out: the CVD oxide film 41 is formed to a thickness that the trenches 33 are not completely filled with the CVD oxide film 41, the polysilicon film 42 is then formed, and, thereafter, only part of the polysilicon film 42 that is located in the gate width direction of the active region 21 is subjected to a thermal oxidation process to thereby form a polysilicon oxide film.

Figure 8A:
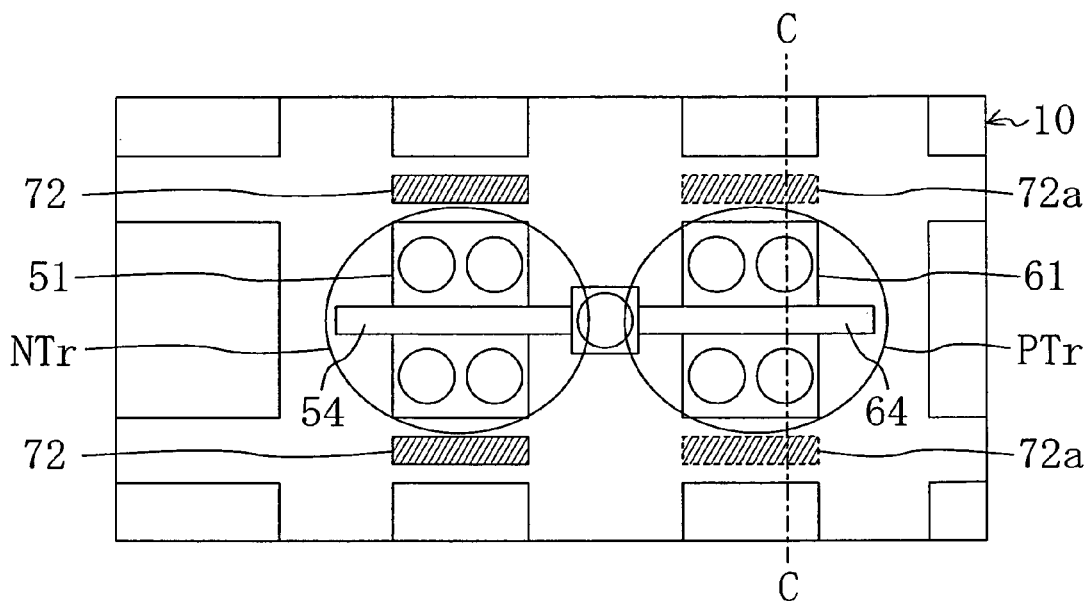
Figure 8B:
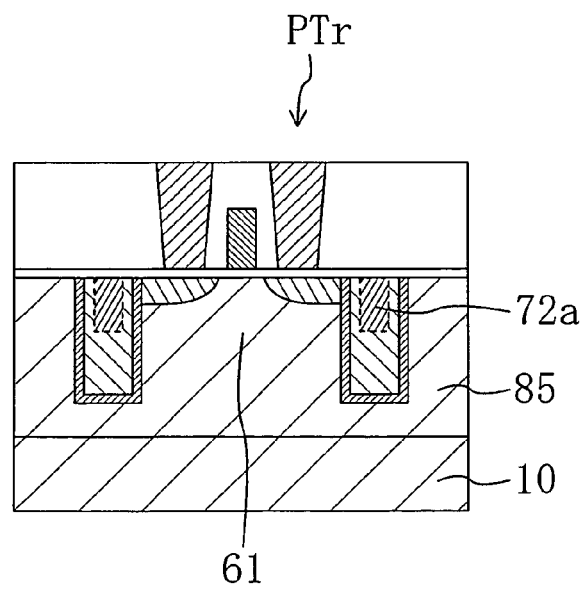
FIG. 8B is a cross-sectional view taken along the line C-C in FIG. 8A.

FIG. 8A is a view illustrating the planar structure of a semiconductor device according to a modified example of the second embodiment. FIG. 8B is a cross-sectional view taken along the line C-C in FIG. 8A. In the semiconductor device of the modified example shown in FIGS. 8A and 8B, an N-channel MIS transistor NTr and a P-channel MIS transistor PTr are arranged on a semiconductor substrate 10. In the semiconductor substrate 10, an N-type well 85 is formed in the region in which the P-channel MIS transistor PTr is formed, while a P-type well (not shown) is formed in the region in which the N-channel MIS transistor NTr is formed.

In this modified example, the direction in which gate electrodes 54 and 64 are provided is different from that in the above-described embodiment. Furthermore, the regions in trench isolations where polysilicon and polysilicon oxide films 72 and 72a are provided are also different. That is, the regions in the trench isolations where the films are provided are changed so that stress can be applied to each channel in the gate length direction.

Now, the structure of the semiconductor device of this modified example will be described in detail. The gate electrode 54 in the N-channel MIS transistor NTr and the gate electrode 64 in the P-channel MIS transistor PTr are formed of a single gate interconnect. And, in the trench isolation for the N-channel MIS transistor NTr, the middle portion of part thereof located at each of both sides (i.e., both sides in the gate length direction) of the active region 51 is filled with the polysilicon film 72. On the other hand, in the trench isolation for the P-channel MIS transistor PTr, the middle portion of part thereof located at each of both sides (i.e., both sides in the gate length direction) of the active region 61 is filled with the polysilicon oxide film 72a. In the other respects, the structure and fabrication method of the semiconductor device of this modified example are the same as those described in the above embodiment, and the descriptions thereof will be thus omitted herein.

In this embodiment, after the CVD oxide film 41 is formed in the process step shown in FIG. 5C, the polysilicon film 42 is formed in the process step shown in FIG. 5D. Nevertheless, the CVD oxide film 41 does not necessarily have to be formed. In that case, after the silicon oxide film 34 is formed by thermal oxidation in the process step shown in FIG. 5B, a polysilicon film may be formed on the silicon oxide film 34 to fill in the trenches 33. Thereafter, by performing a method such as shown in FIGS. 6B to 6D, portions of the polysilicon film located at both sides of the active region 21 (i.e., both sides in the gate width direction) in the N-channel MIS transistor NTr may be subjected to a thermal oxidation process to thereby form polysilicon oxide films. Alternatively, by performing a method such as shown in FIG. 8, portions of the polysilicon film located at both sides of the active region 61 (i.e., both sides in the gate length direction) in the P-channel MIS transistor PTr may be subjected to a thermal oxidation process to thereby form polysilicon oxide films. In this case, the silicon oxide film 34 allows the insulating properties of the trench isolations to be maintained.

In this embodiment, the case in which the trenches 33 are filled with the polysilicon film 42 has been described, but amorphous silicon may be used in place of the polysilicon film 42.

Third Embodiment

Figure 9A:
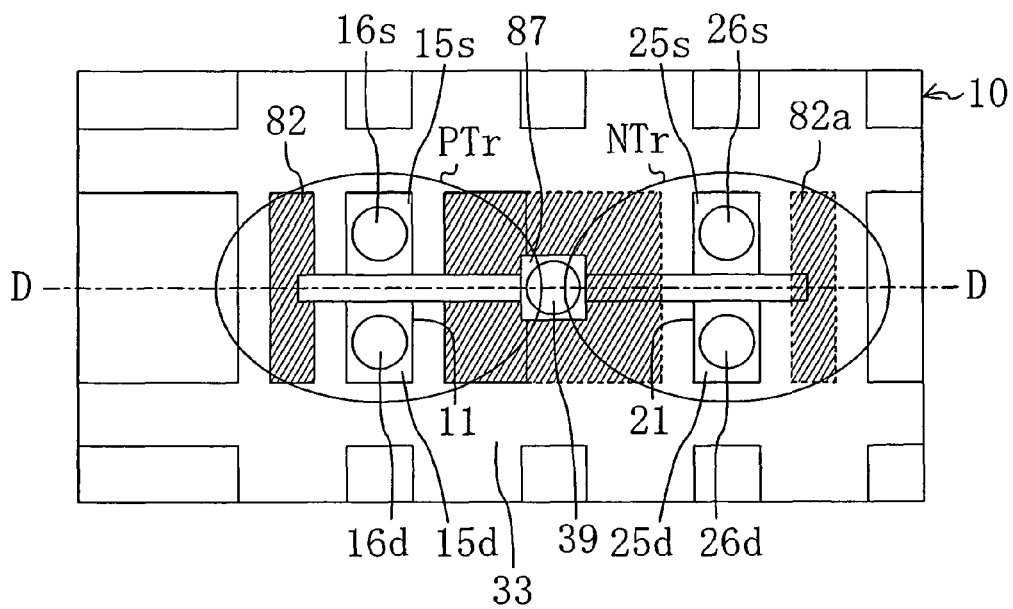
Figure 9B:
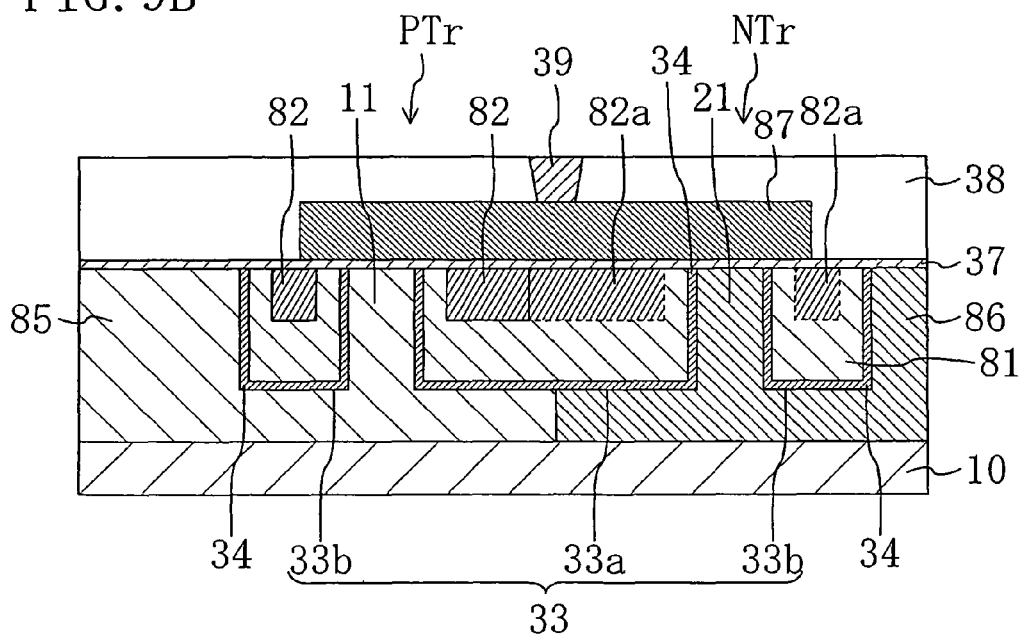
FIG. 9B is a cross-sectional view taken along the line D-D in FIG. 9A.

FIG. 9A is a view illustrating the planar structure of a semiconductor device according to a third embodiment of the present invention. FIG. 9B is a cross-sectional view taken along the line D-D in FIG. 9A. As shown in FIGS. 9A and 9B, in the semiconductor device of this embodiment, an N-channel MIS transistor NTr and a P-channel MIS transistor PTr are arranged on a semiconductor substrate 10. In this embodiment, an exemplary case, in which the gate length direction matches with the <100> direction of the semiconductor substrate 10, will be described.

In the semiconductor substrate 10, an N-type well 85 is formed in the region in which the P-channel MIS transistor PTr is formed, while a P-type well 86 is formed in the region in which the N-channel MIS transistor NTr is formed.

The lateral faces of an active region 11 in the P-channel MIS transistor PTr and the lateral face of an active region 21 in the N-channel MIS transistor NTr are surrounded by a trench 33. In the trench 33, a portion 33a located between the active regions 11 and 21 is formed to have a greater width than the other portions 33b.

In the portion 33a of the trench 33 located between the active regions 11 and 21, the surface of the trench 33 is covered with a silicon oxide film 34 formed by a thermal oxidation process, and a CVD oxide film 81 having the shape of a recess is formed on the silicon oxide film 34. On the CVD oxide film 81, a polysilicon film 82 is formed in a portion in the recess that is closer to the active region 11, while a polysilicon oxide film 82a is formed in a portion in the recess that is closer to the active region 21.

A gate electrode 87 made of polysilicon is formed in a region over the active region 11 and over parts of the trench 33 located at both sides of the active region 11, with a gate insulating film 37 interposed therebetween. In portions in the active region 11 located at the sides of the gate electrode 87, a source region 15s and a drain region 15d are formed.

On the other hand, the gate electrode 87 made of polysilicon is formed in a region over the active region 21 and over parts of the trench 33 located at both sides of the active region 21, with the gate insulating film 37 interposed therebetween. In portions in the active region 21 located at the sides of the gate electrode 87, a source region 25s and a drain region 25d are formed.

The P-channel MIS transistor PTr and the N-channel MIS transistor NTr are covered with an interlayer dielectric film 38. A source contact 16s and a drain contact 16d are formed on the source region 15s and the drain region 15d, respectively, through the interlayer dielectric film 38. And a source contact 26s and a drain contact 26d are formed on the source region 25s and the drain region 25d, respectively, through the interlayer dielectric film 38. On the gate electrode 87, a common gate contact 39 is formed through the interlayer dielectric film 38.

Now, it will be described how to fabricate the semiconductor device of this embodiment with reference to related drawings. FIGS. 10A to 12D are cross-sectional views illustrating process steps for fabricating the semiconductor device according to the third embodiment of the present invention. In FIGS. 10A to 12D, there are provided a region (P-channel MIS transistor formation region) Rp in which a P-channel MIS transistor PTr is to be formed, and a region (N-channel MIS transistor formation region) Rn in which an N-channel MIS transistor NTr is to be formed.

Figure 10A:
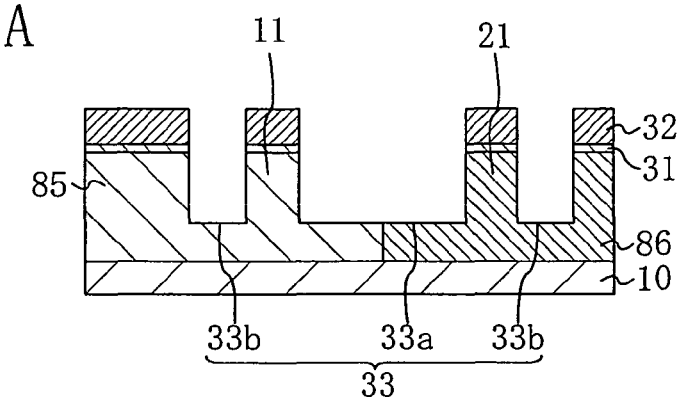
FIGS. 10A through 10D are cross-sectional views illustrating process steps for fabricating the semiconductor device according to the third embodiment of the present invention.

In the fabrication method of this embodiment, the following process steps are first performed to obtain the structure shown in FIG. 10A. First, in a semiconductor substrate 10 made of silicon, an N-type well 85 is formed in the P-channel MIS transistor formation region Rp and a P-type well 86 is formed in the N-channel MIS transistor formation region Rn. Then, a silicon oxide film 31 and a silicon nitride film 32 are deposited in this order over the semiconductor substrate 10 by CVD process. Next, a resist pattern (not shown) having an opening corresponding to an isolation formation region is formed on the silicon nitride film 32. Thereafter, with the resist pattern used as a mask, an etching process is performed to remove unnecessary part of the silicon nitride film 32 and silicon oxide film 31 and then remove part of the semiconductor substrate 10 to the desired depth, thereby forming a trench 33. The trench 33 is formed in a region in the semiconductor substrate 10 that surrounds the active regions 11 and 21. In the trench 33, a portion 33a located between the active regions 11 and 21 is formed to have a greater width than the other portions 33b.

Figure 10B:
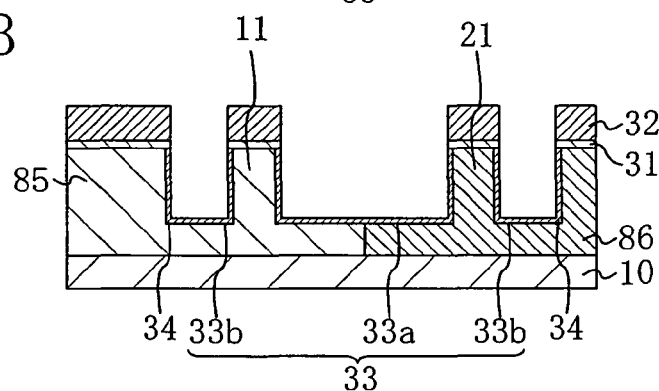

Subsequently, in the process step shown in FIG. 10B, the semiconductor substrate 10 is subjected to a thermal oxidation process, thereby forming a silicon oxide film 34 on the surfaces of the trench 33.

Figure 10C:
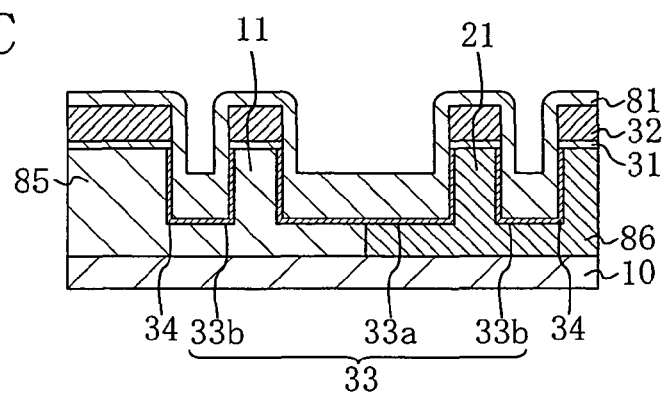

Then, in the process step shown in FIG. 10C, a CVD oxide film 81 is formed over the entire surface of the semiconductor substrate 10 so as to cover the bottom and lateral faces of the trench 33. In this process step, the CVD oxide film 81 is formed to such a thickness that the trench 33 is not completely filled with the CVD oxide film 81 and a recess is left in the center in each of the portions 33a and 33b in the trench 33

Figure 10D:
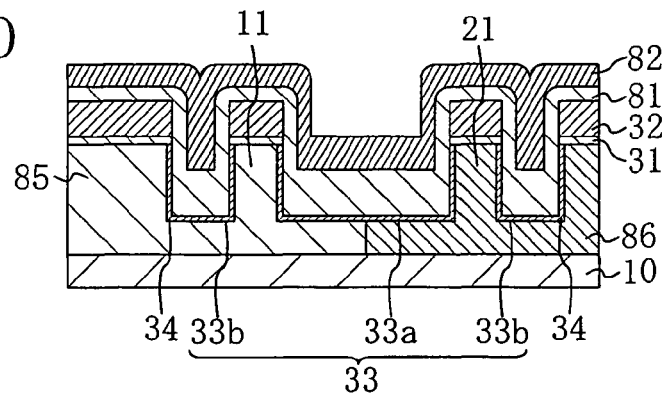

Next, in the process step shown in FIG. 10D, a polysilicon film 82 is formed on the CVD oxide film 81. In this process step, the polysilicon film 82 is formed to a thickness that allows each trench portion 33b to be completely filled with the polysilicon film 82, while permitting the recess to remain in the trench portion 33a.

Figure 11A:
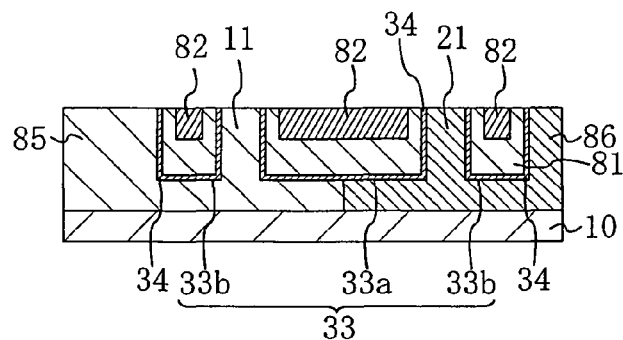
FIGS. 11A through 11D are cross-sectional views illustrating process steps for fabricating the semiconductor device according to the third embodiment of the present invention.

Next, in the process step shown in FIG. 11A, the CVD oxide film 81 and the polysilicon film 82 are polished and removed by a CMP process, and the silicon nitride film 32 and the silicon oxide film 31 are etched, thereby exposing the surface of the semiconductor substrate 10.

Figure 11B:
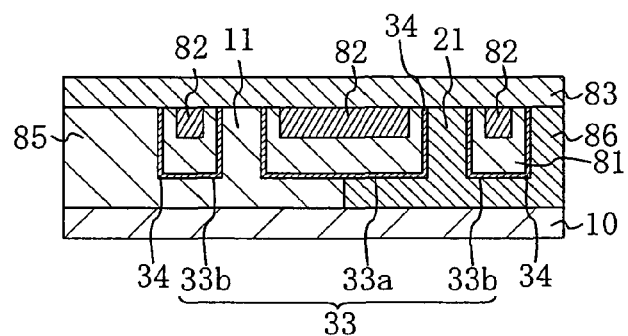

Subsequently, in the process step shown in FIG. 11B, a silicon nitride film 83 is deposited over the entire surface of the semiconductor substrate 10.

Figure 11C:
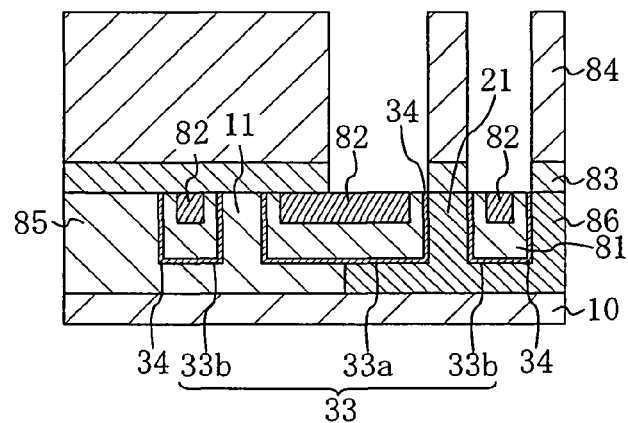

Next, in the process step shown in FIG. 11C, a resist pattern 84, which covers the part of the trench located in the P-channel MIS transistor formation region Rp and has an opening over the part of the trench located in the N-channel MIS transistor formation region Rn, is formed on the silicon nitride film 83. Then, with the resist pattern 84 used as a mask, an etching process is performed, thereby removing part of the silicon nitride film 83 on the part of the trench 33 located in the N-channel MIS transistor formation region Rn. In this process step, in the portion 33a of the trench 33 located between the active regions 11 and 21, the part of the silicon nitride film 83 that is closer to the active region 21 is removed, while the part of the silicon nitride film 83 that is closer to the active region 11 is left.

Figure 11D:
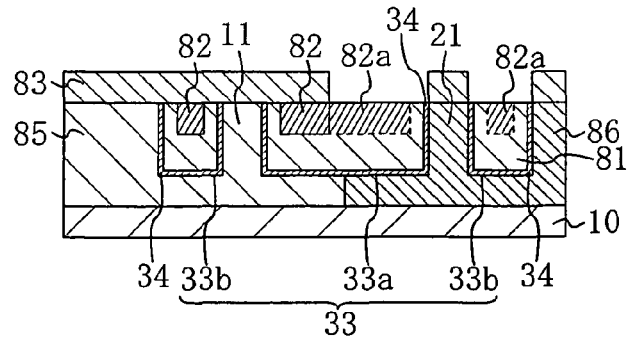

Then, in the process step shown in FIG. 11D, with the silicon nitride film 83 used as a mask, the polysilicon film 82 is subjected to a thermal oxidation process, whereby the polysilicon film 82 in the part of the trench in the N-channel MIS transistor formation region Rn is changed to a polysilicon oxide film 82a. At this time, the polysilicon film 82 in the part of the trench 33 in the P-channel MIS transistor formation region Rp remains as it is. That is, in the portion 33a of the trench 33 located between the active regions 11 and 21, the polysilicon oxide film 82a is formed in the part closer to the active region 21, while the polysilicon film 82 remains in the part closer to the active region 11.

Figure 12A:
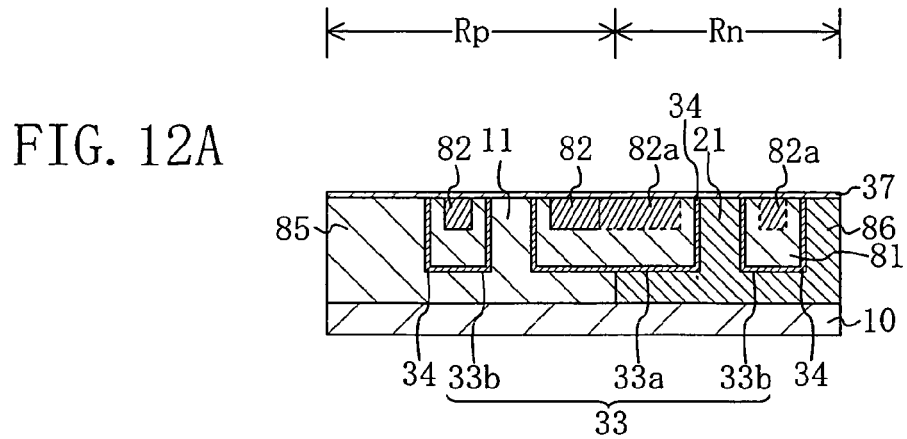
FIGS. 12A through 12D are cross-sectional views illustrating process steps for fabricating the semiconductor device according to the third embodiment of the present invention.
Figure 12B:
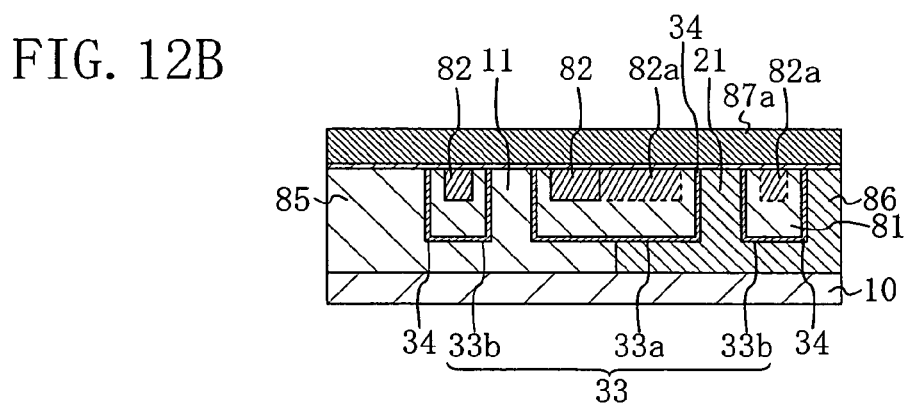
Figure 12C:
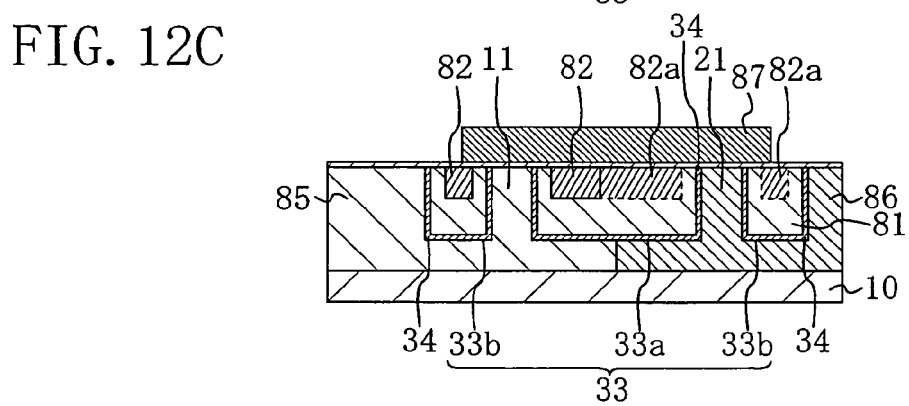
Figure 12D:
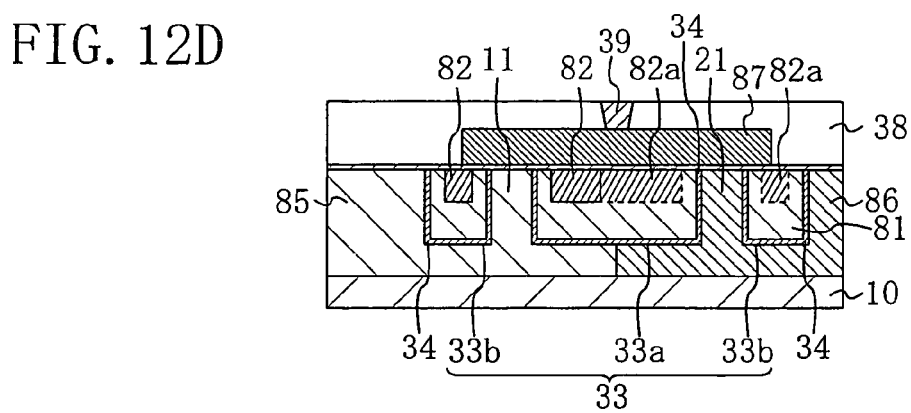
Figure 14:
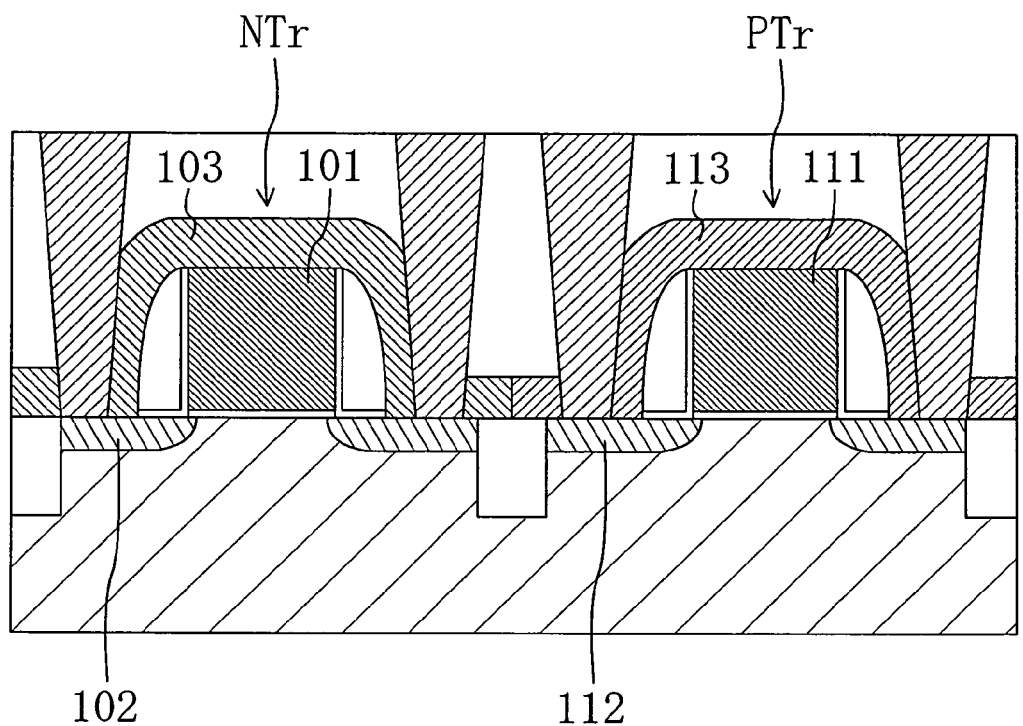
FIG. 14 is a cross-sectional view illustrating the structure of a conventional semiconductor device.

Next, in the process step shown in FIG. 12A, a gate insulating film 37 is formed over the semiconductor substrate 10. Thereafter, in the process step shown in FIG. 12B, a polysilicon film 87a is formed. Subsequently, in the process step shown in FIG. 12C, the polysilicon film 87a is patterned, thereby forming a gate electrode 87. Then, in the process step shown in FIG. 12D, an interlayer dielectric film 38, and contacts 16s, 16d, 26s, 26d and 39 are formed. By the foregoing process steps, the semiconductor device of this embodiment is obtained.

In this embodiment, the same effects as those obtained in the second embodiment are achievable.

Although in the case described in this embodiment, in the trench isolation, the type of film provided at both sides of one active region in the gate width direction is different from the type of film provided at both sides of the other active region in the gate width direction, but the different types of films may be provided in the gate length directions.

In this embodiment, the CVD oxide film 81 is formed in the process step shown in FIG. 10C, and then the polysilicon film 82 is formed in the process step shown in FIG. 10D. Nevertheless, the CVD oxide film 81 does not necessarily have to be formed. In that case, after the silicon oxide film 34 is formed by thermal oxidation in the process step shown in FIG. 10B, the trench 33 may be filled with a polysilicon film, which is formed on the silicon oxide film 34. And thereafter, the polysilicon film may be subjected to thermal oxidation. In this case, the silicon oxide film 34 also allows the insulating properties of the trench isolation to be maintained.

It should be noted that although in the case described in this embodiment, the trench 33 is filled with the polysilicon film 82, amorphous silicon may be used in place of the polysilicon film 82.

Other Embodiments

In the cases described in the foregoing embodiments, the semiconductor devices include an N-channel transistor and a P-channel transistor. However, the present invention is also applicable to a semiconductor device that includes N-channel transistors or P-channel transistors which require different driving forces.

Also, in the foregoing embodiments, the semiconductor substrate is disposed in such a manner that the gate length direction matches with the <100> direction. Nevertheless, the present invention is also applicable to cases in which the semiconductor substrate is disposed so that the gate length direction matches with the <110> direction. In those cases, it is also possible to adjust the driving force of each MIS transistor by adjusting the direction and magnitude of stress that the trench isolation applies to the channel. FIGS. 13A and 13B illustrate the directions and magnitudes of stresses that increase the driving forces of MIS transistors. FIG. 13A illustrates a case where a semiconductor substrate whose <110> direction matches with the gate length direction is used, while FIG. 13B illustrates a case where a semiconductor substrate whose <100> direction matches with the gate length direction is used. As shown in FIGS. 13A and 13B, it is possible to increase the driving force of each transistor by adjusting the direction and magnitude of stress for each transistor.

What is claimed is:

1. A semiconductor device, comprising:
a first semiconductor region in which a first MIS transistor is formed;
a second semiconductor region in which a second MIS transistor is formed;
a first trench isolation region surrounding all lateral sides of the first semiconductor region and having a first plasma SiN film filling in a first recess, the first plasma SiN film applying tensile stress to a channel region in the first MIS transistor; and
a second trench isolation region surrounding all lateral sides of the second semiconductor region and having a second plasma SiN film filling in a second recess, the second plasma SiN film applying compressive stress to a channel region in the second MIS transistor,
wherein the second plasma SiN film surrounds said all lateral sides of the second semiconductor region.

2. The semiconductor device of claim 1, wherein direction or magnitude of stress that the first trench isolation region applies to a channel of the first MIS transistor is different from direction or magnitude of stress that the second trench isolation region applies to a channel of the second MIS transistor.

3. The semiconductor device of claim 1, wherein the first MIS transistor is an N-channel MIS transistor, and the second MIS transistor is a P-channel MIS transistor.

4. The semiconductor device of claim 1, wherein:
the first trench isolation region has a first trench formed in a semiconductor substrate, a first silicon oxide film formed on a surface of the first trench, and the first plasma SiN film filling in the first recess surrounded by the first silicon oxide film in the first trench, and
the second trench isolation region has a second trench formed in the semiconductor substrate, a second silicon oxide film formed on a surface of the second trench, and the second plasma SiN film filling in the second recess surrounded by the second silicon oxide film in the second trench.

5. The semiconductor device of claim 3, wherein
the first trench isolation region applies tensile stress to a channel region of the N-channel MIS transistor, and
the second trench isolation region applies compressive stress to a channel region of the P-channel MIS transistor.

6. The semiconductor device of claim 1, wherein
each of the first plasma SiN film and the second plasma SiN film has a planarized upper surface.

7. The semiconductor device of claim 1, wherein
an upper surface of the first plasma SiN film and an upper surface of the second plasma SiN film are located at the same level.

8. The semiconductor device of claim 1, wherein
the second plasma SiN film is not formed in the first trench isolation region, and the first plasma SiN film is not formed in the second trench isolation region.

9. The semiconductor device of claim 1, wherein
the first plasma SiN film and the second plasma SiN film are formed under different fabrication conditions, and have different film qualities and densities.

10. The semiconductor device of claim 1, wherein the first plasma SiN film surrounds said all lateral sides of the first semiconductor region.

* * * * *